(12) United States Patent
Zhang et al.

(10) Patent No.: US 10,141,243 B2
(45) Date of Patent: Nov. 27, 2018

(54) THYRISTOR ASSEMBLY RADIATOR FOR DC CONVERTER VALVE

(71) Applicants: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

(72) Inventors: Xiang Zhang, Jiangsu (CN); Taixun Fang, Jiangsu (CN); Dongming Cao, Jiangsu (CN); Chihan Chen, Jiangsu (CN); Guangtai Zhang, Jiangsu (CN); Haibin Liu, Jiangsu (CN)

(73) Assignees: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 15/747,769

(22) PCT Filed: Jul. 13, 2016

(86) PCT No.: PCT/CN2016/089942
§ 371 (c)(1),
(2) Date: Jan. 26, 2018

(87) PCT Pub. No.: WO2017/016390
PCT Pub. Date: Feb. 2, 2017

(65) Prior Publication Data
US 2018/0218965 A1  Aug. 2, 2018

(30) Foreign Application Priority Data

Jul. 28, 2015 (CN) .......................... 2015 1 0452042

(51) Int. Cl.
*H01L 23/473* (2006.01)
*H01L 23/367* (2006.01)
(Continued)

(52) U.S. Cl.
CPC ............. *H01L 23/473* (2013.01); *H01C 1/08* (2013.01); *H01L 23/367* (2013.01); *H01L 25/117* (2013.01); *H03K 17/72* (2013.01)

(58) Field of Classification Search
CPC ....... H05K 7/20927–7/20936; H05K 7/20218; H05K 7/20263; H05K 7/1432;
(Continued)

(56) References Cited

U.S. PATENT DOCUMENTS

| 8,385,068 B2 * | 2/2013 | Jacobson | H01L 23/473 165/104.33 |
| 2012/0087092 A1 * | 4/2012 | Huber | F28D 15/00 361/701 |
| 2014/0198453 A1 * | 7/2014 | Zhang | H01L 23/473 361/699 |

FOREIGN PATENT DOCUMENTS

| CN | 103579144 | 2/2014 |
| CN | 203909232 | 10/2014 |

(Continued)

OTHER PUBLICATIONS

"International Search Report (Form PCT/ISA/210)", dated Oct. 25, 2016, with English translation thereof, pp. 1-4.

*Primary Examiner* — Dion R Ferguson
*Assistant Examiner* — Amir Jalali
(74) *Attorney, Agent, or Firm* — JCIPRNET

(57) ABSTRACT

A thyristor assembly radiator for a DC converter valve. A water discharging port of an $N^{th}$ radiator is communicated with a water discharging port of an $(N-2)^{th}$ radiator. A water feeding port of the $N^{th}$ radiator is communicated with a water feeding port of an $(N+2)^{th}$ radiator. Or, a water feeding
(Continued)

port of the $N^{th}$ radiator is communicated with a water feeding port of the $(N-2)^{th}$ radiator, and a water discharging port of the $N^{th}$ radiator is communicated with a water discharging port of the $(N+2)^{th}$ radiator. A water discharging port of an $M^{th}$ radiator is communicated with a water discharging port of an $(M-2)^{th}$ radiator, and a water feeding port of the $M^{th}$ radiator is communicated with a water feeding port of an $(M+2)^{th}$ radiator, or a water feeding port of an $M^{th}$ radiator is communicated with a water feeding port of the $(M-2)^{th}$ radiator, and a water discharging port of the $M^{th}$ radiator is communicated with a water discharging port of an $(M+2)^{th}$ radiator. Water feeding ports of the last two radiators are communicated. According to the radiator, the number of joints of a cooling system is reduced, the risk of leakage is lowered, the operation reliability of a converter valve is improved, the maintenance difficulty is lowered, and the maintenance time is shortened.

5 Claims, 1 Drawing Sheet

(51) Int. Cl.
  *H01C 1/08* (2006.01)
  *H01L 25/11* (2006.01)
  *H03K 17/72* (2006.01)

(58) Field of Classification Search
  CPC ............. H05K 7/2039; H05K 7/20445; H05K 7/20272; H01L 23/473; H01H 9/52; H01H 2009/526
  USPC ................... 361/699, 701–702; 363/141; 165/80.4–80.5, 104.33; 257/712–714; 174/547–548
  See application file for complete search history.

(56) References Cited

FOREIGN PATENT DOCUMENTS

| | | |
|---|---|---|
| CN | 104201161 | 12/2014 |
| CN | 105070697 | 11/2015 |
| JP | 2013026434 | 2/2013 |
| JP | 2013026434 A * | 2/2013 |

* cited by examiner ion no. 201510452042.3, filed on Jul. 28, 2015. The entirety of each of the above-mentioned patent applications is hereby incorporated by reference herein and made a part of this specification.

THYRISTOR ASSEMBLY RADIATOR FOR DC CONVERTER VALVE

CROSS-REFERENCE TO RELATED APPLICATION

This application is a 371 application of the international PCT application serial no. PCT/CN2016/089942, filed on Jul. 13, 2016, which claims the priority benefit of China application no. 201510452042.3, filed on Jul. 28, 2015. The entirety of each of the above-mentioned patent applications is hereby incorporated by reference herein and made a part of this specification.

TECHNICAL FIELD

The present invention belongs to the field of DC transmission converter valves, and in particular, to a thyristor assembly radiator for a DC converter valve.

BACKGROUND

DC converter valves are core devices for DC transmission. A converter valve usually includes a plurality of components. The components of the converter valve include a thyristor assembly, an anode reactor, etc. The thyristor assembly further includes a thyristor, a radiator, a damping resistor, a damping capacitor, and an associated cooling system. The converter valve has a complex structure and includes many parts. The converter valve may suffer from failures due to various reasons during operation, and needs to be repaired in time if failure occurs, so as to resume its normal operation. Therefore, the convenience of device maintenance needs to be considered at various stages in the design process of the converter valve.

Currently, there are primarily two forms of damping resistors for a thyristor assembly. In the first form, the damping resistor is a water resistor, and the damping resistor is in direct contact with cooling water, dissipates heat independently, and has nothing to do with the thyristor radiator and cooling water pipeline thereof. When the cooling system operates normally, the damping resistor can dissipate heat well. However, if the damping resistor is faulty and needs maintenance, the cooling water inside the converter valve has to be discharged completely before the maintenance can be done. As a result, the maintenance is difficult and time consuming. In the second form, the damping resistor is a rod resistor. A plurality of rod resistors are disposed inside through holes provided beforehand in the thyristor radiator, and the damping resistors dissipate heat indirectly via the thyristor radiator, reducing the number of joints inside the converter valve assembly. However, some rod resistors may interfere with the cooling water pipeline of the thyristor radiator. As a result, when a rod resistor interfering with the cooling water pipeline is to be maintained, cooling water in the converter valve still needs to be discharged completely before the cooling water pipeline can be disassembled, leading to difficult maintenance.

SUMMARY

An objective of the present invention is to provide a thyristor assembly radiator for a DC converter valve.

To achieve the foregoing objective, the present invention provides a solution as follows: A thyristor assembly radiator for a DC converter valve includes radiators, a thyristor being disposed between every two adjacent radiators, where each of the radiators includes a housing, a water feeding port is provided at an upper part of the housing, a water discharging port is provided at a lower part thereof, and through holes in the housing of the radiator for accommodating damping resistors are provided between the water feeding port and the water discharging port; a water discharging port of an $N^{th}$ radiator is communicated with a water discharging port of an $(N-2)^{th}$ radiator via a pipeline, and a water feeding port of the $N^{th}$ radiator is communicated with a water feeding port of an $(N+2)^{th}$ radiator via a pipeline, or a water feeding port of an $N^{th}$ radiator is communicated with a water feeding port of the $(N-2)^{th}$ port via a pipeline, and the water discharging port of the $N^{th}$ radiator is communicated with a water discharging port of the $(N+2)^{th}$ radiator via a pipeline, where $N \geq 3$, and N is an odd number; a water discharging port of an $M^{th}$ radiator is communicated with a water discharging port of an $(M-2)^{th}$ radiator via a pipeline, and a water feeding port of the $M^{th}$ radiator is communicated with a water feeding port of an $(M+2)^{th}$ radiator via a pipeline, or the water feeding port of the $M^{th}$ radiator is communicated with a water feeding port of the $(M-2)^{th}$ radiator via a pipeline, and the water discharging port of the $M^{th}$ radiator is communicated with a water discharging port of the $(M+2)^{th}$ radiator via a pipeline, where $M \geq 4$, and M is an even number; and water feeding ports of the last two radiators are communicated with each other via a pipeline.

In an improved technical solution of the present invention, the $N^{th}$ radiator is communicated with the $(N-2)^{th}$ radiator via a $(N-2)^{th}$ type A bent pipeline, and the $N^{th}$ radiator is also communicated with the $(N+2)^{th}$ radiator via a $N^{th}$ type A bent pipeline.

In an improved technical solution of the present invention, the type A bent pipelines include a longitudinal pipe and two transverse pipes parallel to each other, one end of each of the transverse pipes is communicated with a radiator, and the other end thereof is communicated with the longitudinal pipe.

In an improved technical solution of the present invention, the $M^{th}$ radiator is communicated with the $(M-2)^{th}$ radiator via a $(M-2)^{th}$ type B bent pipeline, the $M^{th}$ radiator is also communicated with the $(M+2)^{th}$ radiator via a $M^{th}$ type B bent pipeline, and the type B bent pipelines include a longitudinal pipe and elbows that are communicated with the longitudinal pipe and located at two ends of the longitudinal pipe.

In an improved technical solution of the present invention, each of the elbows includes a first transverse pipe, an inclined pipe, and a second transverse pipe; the first transverse pipe, the inclined pipe, and the second transverse pipe are communicated with each other successively, and the first transverse pipe is parallel to the second transverse pipe.

By means of the foregoing solution, the present invention has the following beneficial effects:

1. A damping resistor is disposed inside a thyristor radiator, so that the number of joints of a cooling system is reduced, the risk of leakage is lowered, and the operation reliability of a converter valve is improved.

2. The damping resistor disposed inside the thyristor radiator does not interfere with a water pipe of the radiator, so that the water pipe does not need to be disassembled when the damping resistor is maintained, thereby reducing the maintenance difficulty of a thyristor assembly, and reducing the maintenance time.

DESCRIPTION OF EMBODIMENTS

The following further describes in detail the technical solutions of the present invention with reference to the accompanying drawings and specific embodiments.

Embodiment 1

Figure 1:
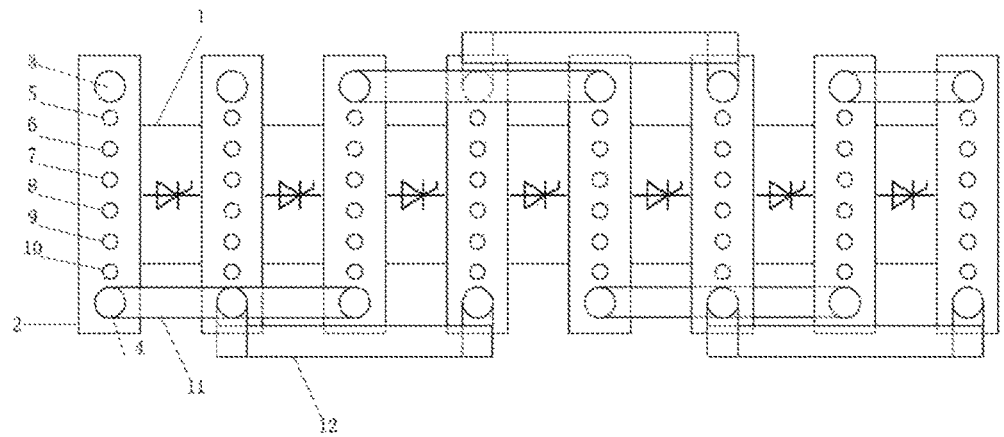
FIG. 1 is a schematic structural view according to the present invention.
Figure 2:
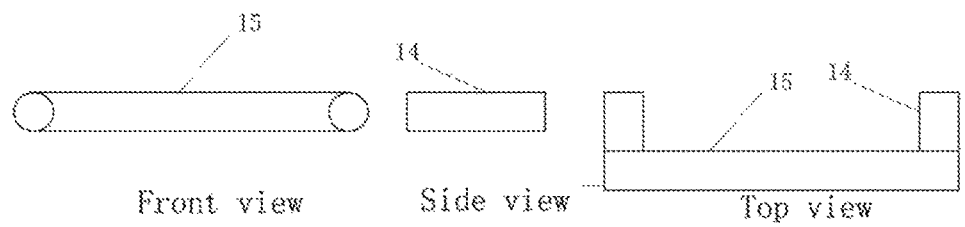
FIG. 2 is a schematic structural view of a straight pipe according to the present invention.
Figure 3:
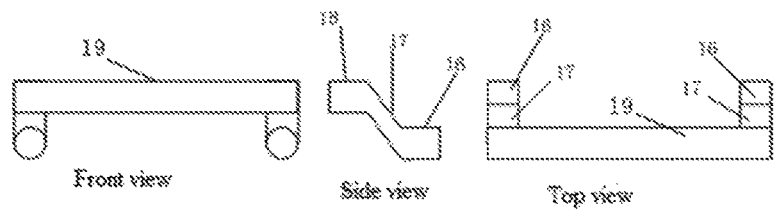
FIG. 3 is a schematic structural view of an elbow according to the present invention.

With reference to FIG. 1, FIG. 2, and FIG. 3, the present thyristor assembly radiator for a DC converter valve includes radiators 2, and a thyristor 1 is disposed between every two adjacent radiators 2. Each of the radiators 2 includes a housing, a water feeding port 3 is disposed at an upper part of the housing, a water discharging port 4 is disposed at a lower part thereof, and through holes 5 to 10 in the housing of the radiator for accommodating damping resistors are provided between the water feeding port 3 and the water discharging port 4. A water discharging port 4 of the first radiator 2 is communicated with a water discharging port 4 of the third radiator 2 via a pipeline 11, a water feeding port 3 of the third radiator 2 is communicated with a water feeding port 3 of the fifth radiator 2 via a pipeline, and a water discharging port 4 of the fifth radiator 2 is communicated with a water discharging port 4 of the seventh radiator 2 via a pipeline 11. A water discharging port 4 of the second radiator 2 is communicated with a water discharging port 4 of the fourth radiator 2, a water feeding port 3 of the fourth radiator 2 is communicated with a water feeding port 3 of the sixth radiator 2, and a water discharging port 4 of the sixth radiator 2 is communicated with a water discharging port 4 of the eighth radiator 2. Water feeding ports 3 of the last two radiators 2 are communicated with each other via a pipeline.

In a preferable solution, radiators numbered with odd numbers are communicated with each other via a type A bent pipeline 11, the type A bent pipeline 11 includes a longitudinal pipe 15 and two transverse pipes 14 parallel to each other, one end of each of the transverse pipes 14 is communicated with a radiator, and the other end thereof is communicated with the longitudinal pipe 15.

Radiators numbered with even numbers are communicated with each other via type B bent pipeline 12, and the type B bent pipeline 12 includes a longitudinal pipe 19 and elbows that are communicated with the longitudinal pipe 19 and located at two ends of the longitudinal pipe 19. Each of the elbows includes a first transverse pipe 16, an inclined pipe 17, and a second transverse pipe 18, the first transverse pipe 16, the inclined pipe 17, and the second transverse pipe 18 are communicated with each other successively, and the first transverse pipe 16 is parallel to the second transverse pipe 18.

A length of a transverse part 14 of the type A bent pipeline 11 is a sum of lengths of the first transverse pipe 16, the second transverse pipe 18, and the inclined pipe 17 of the type B bent pipeline 12.

The foregoing embodiment is merely used to describe a technical idea of the present invention, rather than limiting the protection scope of the present invention. Any change made based on the technical solution according to the technical idea of the present invention shall fall within the protection scope of the present invention.

What is claimed is:

1. A thyristor assembly radiator for a DC converter valve, comprising:
   radiators;
   a thyristor being disposed between every two adjacent radiators, wherein
   each of the radiators comprises a housing, a water feeding port is provided at an upper part of the housing, a water discharging port is provided at a lower part of the housing, and through holes in the housing of the radiator for accommodating damping resistors are provided between the water feeding port and the water discharging port;
   a water discharging port of an $N^{th}$ radiator is communicated with a water discharging port of an $(N-2)^{th}$ radiator via a $(N-2)^{th}$ water discharging pipeline, and a water feeding port of the $N^{th}$ radiator is communicated with a water feeding port of an $(N+2)^{th}$ radiator via a $N^{th}$ water feeding pipeline, or the water feeding port of the $N^{th}$ radiator is communicated with a water feeding port of the $(N-2)^{th}$ radiator via a $(N-2)^{th}$ water feeding pipeline, and the water discharging port of the $N^{th}$ radiator is communicated with a water discharging port of the $(N+2)^{th}$ radiator via a $N^{th}$ water discharging pipeline, wherein $N \geq 3$, and N is an odd number;
   a water discharging port of an $M^{th}$ radiator is communicated with a water discharging port of an $(M-2)^{th}$ radiator via a $(M-2)^{th}$ water discharging pipeline, and a water feeding port of the $M^{th}$ radiator is communicated with a water feeding port of an $(M+2)^{th}$ radiator via a $M^{th}$ water feeding pipeline, or the water feeding port of the $M^{th}$ radiator is communicated with a water feeding port of the $(M-2)^{th}$ radiator via a $(M-2)^{th}$ water feeding pipeline, and the water discharging port of the $M^{th}$ radiator is communicated with a water discharging port of the $(M+2)^{th}$ radiator via a $M^{th}$ water discharging pipeline, wherein $M \geq 4$, and M is an even number; and
   water feeding ports of the last two radiators are communicated with each other via a water feeding pipeline.

2. The thyristor assembly radiator for a DC converter valve according to claim 1, wherein the water discharging port of the $N^{th}$ radiator is communicated with the water discharging port of the $(N-2)^{th}$ radiator via a $(N-2)^{th}$ type A bent pipeline, and the water feeding port of the $N^{th}$ radiator is communicated with the water feeding port of the $(N+2)^{th}$ radiator via a $N^{th}$ type A bent pipeline.

3. The thyristor assembly radiator for a DC converter valve according to claim 2, wherein the type A bent pipelines comprise a longitudinal pipe and two transverse pipes parallel to each other; one end of each of the transverse pipes is communicated with a radiator, and the other end thereof is communicated with the longitudinal pipe.

4. The thyristor assembly radiator for a DC converter valve according to claim 1, wherein the water discharging port of the $M^{th}$ radiator is communicated with the water discharging port of the $(M-2)^{th}$ radiator via a $(M-2)^{th}$ type B bent pipeline, the water feeding port of the $M^{th}$ radiator is also communicated with the water feeding port of the $(M+2)^{th}$ radiator via a $M^{th}$ type B bent pipeline, wherein the type B bent pipelines comprise a longitudinal pipe and elbows that are communicated with the longitudinal pipe and located at two ends of the longitudinal pipe.

5. The thyristor assembly radiator for a DC converter valve according to claim 4, wherein each of the elbows comprises a first transverse pipe, an inclined pipe, and a second transverse pipe, wherein the first transverse pipe, the inclined pipe, and the second transverse pipe are communicated with each other successively, and the first transverse pipe is parallel to the second transverse pipe.

* * * * *